(12) United States Patent
Lee

(10) Patent No.: US 8,698,284 B2
(45) Date of Patent: Apr. 15, 2014

(54) NITRIDE-BASED SEMICONDUCTOR SUBSTRATES HAVING HOLLOW MEMBER PATTERN AND METHODS OF FABRICATING THE SAME

(75) Inventor: Sang-Moon Lee, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 193 days.

(21) Appl. No.: 13/078,145

(22) Filed: Apr. 1, 2011

(65) Prior Publication Data

US 2012/0097975 A1    Apr. 26, 2012

(30) Foreign Application Priority Data

Oct. 26, 2010   (KR) ........................ 10-2010-0104748

(51) Int. Cl.
  *H01L 29/06*   (2006.01)
  *H01L 29/04*   (2006.01)
  *H01L 21/00*   (2006.01)

(52) U.S. Cl.
  USPC .... 257/623; 257/627; 257/628; 257/E33.005; 257/E33.006; 438/41; 438/44

(58) Field of Classification Search
  USPC .......................... 257/103, 621–622, 627–628, 257/E33.005–E33.006, E33.023, E33.025; 438/39, 41–42, 44
  See application file for complete search history.

(56) References Cited

U.S. PATENT DOCUMENTS

| | | | | |
|---|---|---|---|---|
| 5,676,752 | A | * | 10/1997 | Bozler et al. ..................... 117/89 |
| 6,015,979 | A | | 1/2000 | Sugiura et al. |
| 6,861,729 | B2 | * | 3/2005 | Kozaki et al. ................. 257/623 |
| 6,940,098 | B1 | * | 9/2005 | Tadatomo et al. .............. 257/87 |
| 2003/0143771 | A1 | * | 7/2003 | Kidoguchi et al. ............. 438/46 |
| 2004/0147096 | A1 | * | 7/2004 | Kitaoka et al. ................ 438/483 |
| 2005/0221520 | A1 | * | 10/2005 | Ou et al. ........................ 438/29 |

FOREIGN PATENT DOCUMENTS

| | | | |
|---|---|---|---|
| JP | 2002208722 | | 7/2002 |
| JP | 2002246322 | | 8/2002 |
| JP | 2002246322 | A * | 8/2002 |
| KR | 100533910 | | 12/2005 |
| KR | 10-2010-0059499 | A * | 4/2010 |
| KR | 1020100059499 | | 6/2010 |

* cited by examiner

*Primary Examiner* — Cheung Lee
*Assistant Examiner* — Jeremy Joy
(74) *Attorney, Agent, or Firm* — Harness, Dickey & Pierce, P.L.C.

(57) ABSTRACT

A nitride-based semiconductor substrate may includes a plurality of hollow member patterns arranged on a substrate, a nitride-based seed layer formed on the substrate between the plurality of hollow member patterns, and a nitride-based buffer layer on the nitride-based seed layer so as to cover the plurality of hollow member patterns, wherein the plurality of hollow member patterns contact the substrate in a first direction and both ends of each of the plurality of hollow member patterns are open in the first direction.

18 Claims, 10 Drawing Sheets

NITRIDE-BASED SEMICONDUCTOR SUBSTRATES HAVING HOLLOW MEMBER PATTERN AND METHODS OF FABRICATING THE SAME

CROSS-REFERENCE TO RELATED APPLICATION

This application claims priority under 35 U.S.C. §119 to Korean Patent Application No. 10-2010-0104748, filed on Oct. 26, 2010 in the Korean Intellectual Property Office, the disclosure of which is incorporated herein in its entirety by reference.

BACKGROUND

1. Field

The present disclosure relates to a nitride-based semiconductor substrate having a buffer layer where a hollow member pattern is formed, and to a method of fabricating the nitride-based semiconductor substrate.

2. Description of the Related Art

In general, AlGaInN-based nitride semiconductors (including GaN-based) having a light emitting wavelength ranging from an ultraviolet ray to a visible ray and having superior chemical and thermal stability are used as a higher temperature, higher output electronic element. The electronic element may include light emitting diodes or laser diodes.

However, it is relatively difficult to obtain a large-scale GaN single crystal substrate to grow a nitride-based semiconductor. Thus, heterogeneous substrates, such as sapphire, silicon, or silicon carbide (SiC), are used for this purpose. When a nitride-based semiconductor grows on a heterogeneous substrate, a greater amount of strain and stress are generated on a relatively thin film that grows thereon due to a difference in a lattice constant and a thermal expansion coefficient between the heterogeneous substrate and the thin film. Thus, the thin film is not grown as well on a heterogeneous substrate. And, even when the thin film does grow, the defect density is higher in the thin film and/or cracks may be generated in the thin film. The defect may become a non-light emitting area or a path for leakage current such that the optical and electric properties of a device using the nitride-based semiconductor may be deteriorated.

SUMMARY

Example embodiments of the present invention relate to a nitride-based semiconductor substrate in which the defect density of a buffer layer is reduced by forming a hollow member pattern in the buffer layer, and a method of fabricating the nitride-based semiconductor substrate.

Additional aspects will be set forth in the description which follows, of which certain aspects may be inferred from the description, while others may be learned by practice of the examples.

According to a non-limiting aspect of the present invention, a nitride-based semiconductor substrate may include a plurality of hollow member patterns arranged on a substrate, each of the plurality of hollow member patterns having opposing open ends; a nitride-based seed layer formed on the substrate between each of the plurality of hollow member patterns; and a nitride-based buffer layer covering the plurality of hollow member patterns and the nitride-based seed layer, wherein the plurality of hollow member patterns are aligned on the substrate in a first direction such that the opposing ends of each of the plurality of hollow member patterns are open in the first direction.

The substrate may be formed of one selected from a group consisting of silicon, sapphire, silicon carbide, glass, and a III-V group material.

The plurality of hollow member patterns may be arranged in strips parallel to the first direction and separated from one another.

The nitride-based seed layer may have a thickness of about 5 nm-1 μm.

A cross-section of each of the plurality of hollow member patterns may have any one of a rectangular shape, a trapezoidal shape, and a hemispherical shape.

According to another non-limiting aspect of the present invention, a nitride-based semiconductor substrate may include a nitride-based seed layer formed on a substrate; a plurality of hollow member patterns arranged on the nitride-based seed layer, each of the plurality of hollow member patterns having opposing open ends; and a nitride-based buffer layer covering the plurality of hollow member patterns on the nitride-based seed layer, wherein the plurality of hollow member patterns are aligned on the substrate in a first direction such that the opposing ends of each of the plurality of hollow member patterns are open in the first direction.

According to another non-limiting aspect of the present invention, a nitride-based semiconductor substrate may include a plurality of nitride-based seed layer patterns formed on a substrate; a plurality of hollow member patterns arranged on the substrate, each of the plurality of hollow member patterns having opposing open ends, each of the plurality of hollow member patterns being between a pair of adjacent nitride-based seed layer patterns; and a nitride-based buffer layer covering the plurality of hollow member patterns and the plurality of nitride-based seed layer patterns on the substrate, wherein the plurality of hollow member patterns are aligned in a first direction (while contacting the substrate and/or the plurality of nitride-based seed layer patterns) such that the opposing ends of each of the plurality of hollow member patterns are open in the first direction.

According to another non-limiting aspect of the present invention, a method of fabricating a nitride-based semiconductor substrate may include forming a first layer on a substrate, forming a plurality of first layer patterns by patterning the first layer into a plurality of strips that are parallel to and separated from one another, forming a second layer covering the plurality of first layer patterns on the substrate, forming a plurality of second layer patterns by patterning the second layer so as to expose intermittent portions of each of the plurality of first layer patterns, forming a plurality of hollow member patterns from the plurality of second layer patterns by removing the plurality of first layer patterns, and forming a nitride-based seed layer and a nitride-based buffer layer sequentially on the substrate.

The second layer may be formed of a material having an etch selectivity with respect to the first layer.

The first and second layers may be formed of any one of a photoresist layer/silicon oxide pairing, a photoresist layer/silicon nitride pairing, a silicon oxide/silicon nitride pairing, and a silicon nitride/silicon oxide pairing.

Both opposing ends of each of the plurality of second layer patterns may be open in a lengthwise direction of the first layer patterns.

The method may also include forming a first nitride-based seed layer on the substrate and forming the first layer on the first nitride-based seed layer. Furthermore, the nitride-based buffer layer may be formed on the first nitride-based seed layer.

According to another non-limiting aspect of the present invention, a method of fabricating a nitride-based semiconductor substrate may include forming a nitride-based seed layer on a substrate, forming a plurality of nitride-based seed layer patterns in strip form by patterning the nitride-based seed layer, forming a first layer covering the plurality of nitride-based seed layer patterns on the substrate, forming a plurality of first layer patterns by patterning the first layer, each of the plurality of first layer patterns being in strip form and formed between each of the plurality of nitride-based seed layer patterns, forming a second layer covering the plurality of first layer patterns, forming a plurality of second layer patterns by patterning the second layer so as to expose intermittent portions of each of the plurality of first layer patterns, forming a plurality of hollow member patterns from the plurality of second layer patterns by removing the plurality of first layer patterns, and forming a nitride-based buffer layer on the plurality of nitride-based seed layer patterns.

BRIEF DESCRIPTION OF THE DRAWINGS

The above and/or other aspects will become more apparent and readily appreciated when the following description is taken in conjunction with the accompanying drawings of which.

DETAILED DESCRIPTION

Figure 1A:
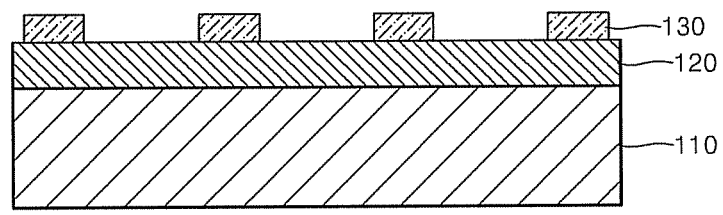
FIGS. 1A-1H are cross-sectional views sequentially illustrating a method of fabricating a nitride-based semiconductor substrate having a hollow member pattern according to a non-limiting embodiment of the present invention.

Reference will now be made in further detail to the following non-limiting embodiments, examples of which are illustrated in the accompanying drawings, wherein like reference numerals refer to the like elements throughout. In this regard, the present embodiments may have different forms and should not be construed as being limited to the descriptions set forth herein. Accordingly, the non-limiting embodiments are merely described below, by referring to the figures, to explain various aspects of the present description.

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms, "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIGS. 1A-1H are cross-sectional views sequentially illustrating a method of fabricating a nitride-based semiconductor substrate 100 having a hollow member pattern according to a non-limiting embodiment of the present invention.

Referring to FIG. 1A, a first dielectric layer 120 is deposited on a substrate 110. The substrate 110 may be formed of silicon, sapphire, silicon carbide (SiC), glass, or a III-V group material such as GaAs, InP, or InSb. The first dielectric layer 120 may be a silicon oxide layer and may have a thickness of about 50 nm-10 μm.

The first dielectric layer 120 may be coated with photoresist (not shown). A photoresist pattern 130 is formed on the first dielectric layer 120 by patterning the photoresist. The photoresist pattern 130 may be in the form of strips that are spaced apart from and parallel to each other.

Figure 1B:
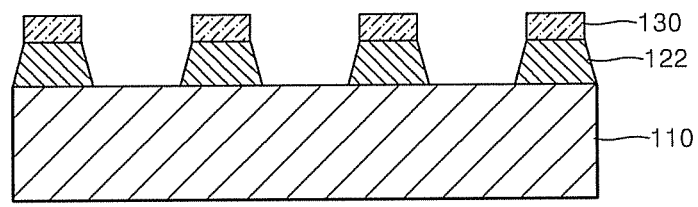

Referring to FIG. 1B, a first dielectric layer pattern 122 arranged parallel to one another in strips may be formed by dry etching the first dielectric layer 120 using the photoresist pattern 130 as a mask. The cross-section of the first dielectric layer pattern 122 may be trapezoidal (refer to FIG. 1B) or rectangular depending on the etch angle during the dry etching. Alternatively, the cross-section of the first dielectric layer pattern 122 may be hemispherical.

Figure 1C:
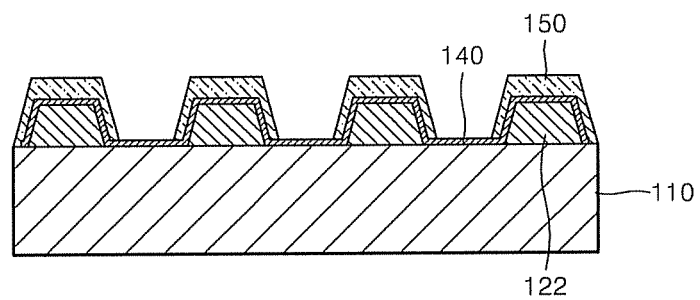
Figure 1D:
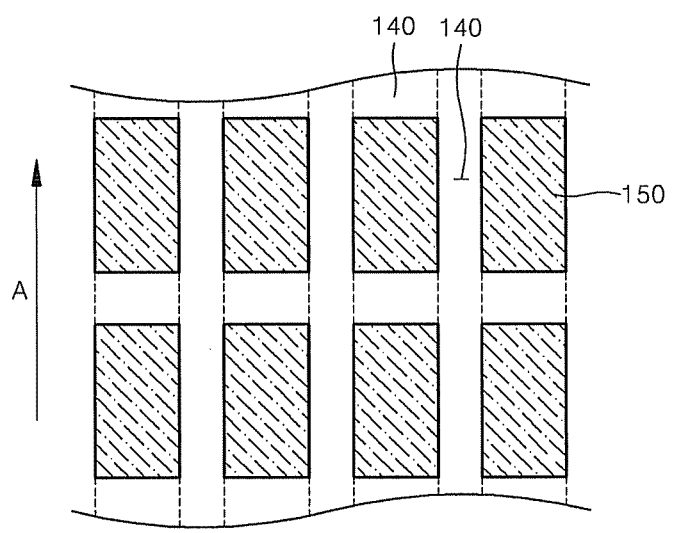

Referring to FIGS. 1C and 1D, in which FIG. 1D is a plan view of FIG. 1C, after the photoresist pattern 130 is removed, a second dielectric layer 140 is deposited on the substrate 110 covering the first dielectric layer pattern 122. The second dielectric layer 140 is formed of a material that can be selectively etched with respect to the first dielectric layer 120. For example, when the first dielectric layer 120 is formed of silicon oxide, the second dielectric layer 140 may be formed of silicon nitride. Conversely, when the first dielectric layer 120 is formed of silicon nitride, the second dielectric layer 140 may be formed of silicon oxide. Alternatively, the first dielectric layer 120 may be formed of photoresist, whereas the second dielectric layer 140 may be formed of silicon oxide or silicon nitride. The second dielectric layer 140 may be formed to a thickness of about 10 nm-500 nm.

A photoresist (not shown) may be coated on the second dielectric layer 140 and then patterned so that a photoresist pattern 150 is formed on the second dielectric layer 140. The photoresist pattern 150 is formed so as to expose intermittent portions of the second dielectric layer 140, as illustrated in FIG. 1C. When viewed from a lengthwise direction (a strip direction) of the first dielectric layer pattern 122 (a direction indicated by an arrow A), as illustrated in FIG. 1D, the photoresist pattern 150 is formed in a plurality of patterns that are separated from one another in the lengthwise direction A of the first dielectric layer pattern 122.

Figure 1E:
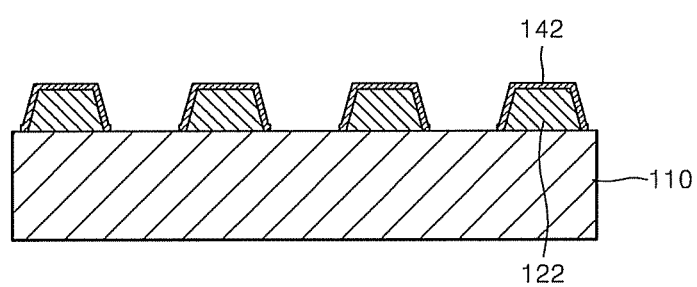
Figure 1F:
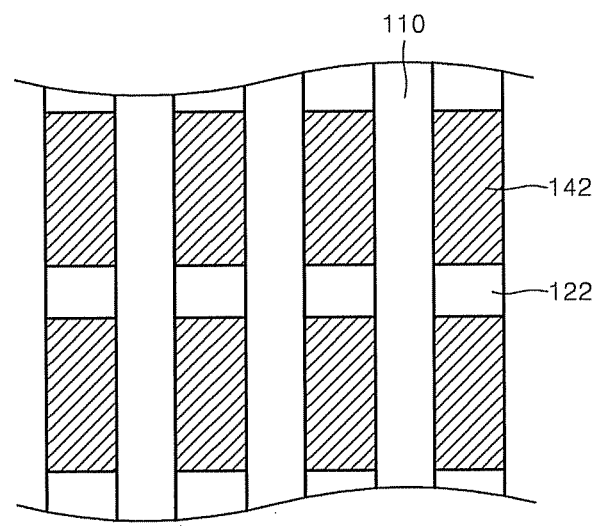

Referring to FIGS. 1E and 1F, in which FIG. 1F is a plan view of FIG. 1E, the exposed portions of the second dielectric layer 140 are removed, and then the photoresist pattern 150 is removed. As a result, a second dielectric layer pattern 142 is formed on the first dielectric layer pattern 122. The second dielectric layer pattern 142 has the same (or similar) shape of the photoresist pattern 150.

Figure 1G:
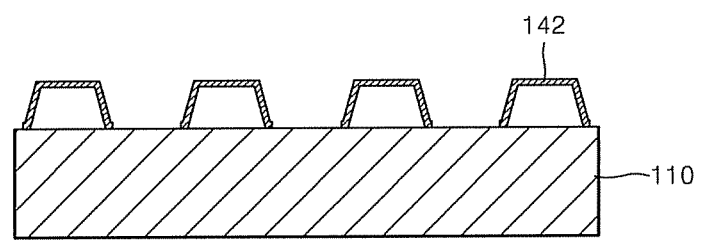

Referring to FIG. 1G, the first dielectric layer pattern 122 may be selectively removed by performing a wet etching over the substrate 110. The portions of the first dielectric layer pattern 122 that are covered with the second dielectric layer pattern 142 are etched and removed when the etchant enters from an area not covered by the second dielectric layer pattern 142. As a result, the second dielectric layer pattern 142 becomes a hollow member pattern, which contacts the substrate 110 in the strip direction (the direction A of FIG. 1D) and is open at both ends in the strip direction.

Figure 1H:
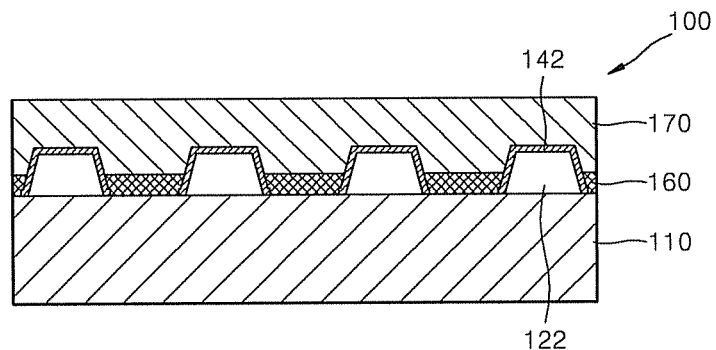

Referring to FIG. 1H, a nitride-based seed layer 160 formed of GaN, AlN, or AlGaN is formed on the substrate 110. The nitride-based seed layer 160 may be deposited relatively slowly at about 500-600° C. to a thickness of about 5 nm-1 μm.

A nitride-based buffer layer 170 is formed on the nitride-based seed layer 160. The nitride-based buffer layer 170 may be formed of GaN. The nitride-based buffer layer 170 may be grown relatively quickly at about 500-1000° C., which may be a temperature that is not less than the temperature for forming the nitride-based seed layer 160. Referring to FIG. 1H, the resultant structure is a nitride-based semiconductor substrate 100 having a hollow member pattern according to a non-limiting embodiment of the present invention.

According to a method of fabricating a nitride-based semiconductor substrate using a hollow member pattern according to the present non-limiting embodiment, since the strain and stress generated on a boundary surface between the substrate 110 and the seed layer 160 is absorbed by the hollow member pattern 142, the defect density of the nitride-based seed layer 160 is reduced such that the defect density of the nitride-based buffer layer 170 is also reduced.

Also, since the nitride-based seed layer 160 formed on the substrate 110 is a vertically grown nitride semiconductor, the defect density thereof is relatively high. In contrast, the nitride-based buffer layer 170 includes a portion that is vertically grown from the nitride-based seed layer 160 and a portion that is horizontally grown over the hollow member pattern 142. Since the defect density of the horizontally grown portion is relatively low, the defect density of the nitride-based buffer layer 170 is lower than that of the nitride-based seed layer 160. As a result, the defect density of the nitride-based buffer layer 170 is reduced.

Light emitting diodes, laser diodes, or transistors may be fabricated by forming a nitride-based semiconductor layer on the nitride-based semiconductor substrate 100 according to the present non-limiting embodiment using a well-known method.

Figure 2A:
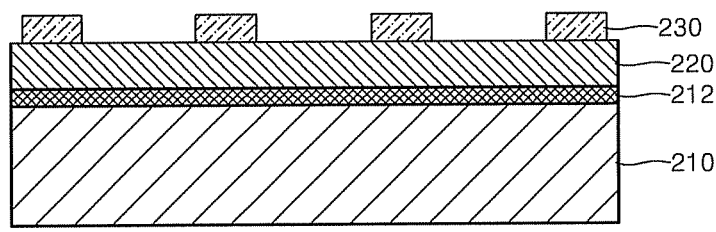
FIGS. 2A-2H are cross-sectional views sequentially illustrating a method of fabricating a nitride-based semiconductor substrate having a hollow member pattern according to another non-limiting embodiment of the present invention.

FIGS. 2A-2H are cross-sectional views sequentially illustrating a method of fabricating a nitride-based semiconductor substrate 200 having a hollow member pattern according to another non-limiting embodiment of the present invention. Referring to FIG. 2A, a nitride-based seed layer 212 is formed on a substrate 210. The substrate 210 may be formed of silicon, sapphire, silicon carbide (SiC), glass, or a III-V group material such as GaAs, InP, or InSb. The nitride-based seed layer 212 may be formed of GaN or AlGaN. The nitride-based seed layer 212 may be grown relatively slowly at about 500-600° C. to a thickness of about 5 nm-1 μm.

A first dielectric layer 220 is deposited on the nitride-based seed layer 212. The first dielectric layer 220 may be a silicon oxide layer and may be formed to a thickness of about 50 nm-10 μm.

A photoresist (not shown) is coated on the first dielectric layer 220 and then patterned so that a photoresist pattern 230 is formed on the first dielectric layer 220. The photoresist pattern 230 may be in the form of strips that are separated from one another.

Figure 2B:
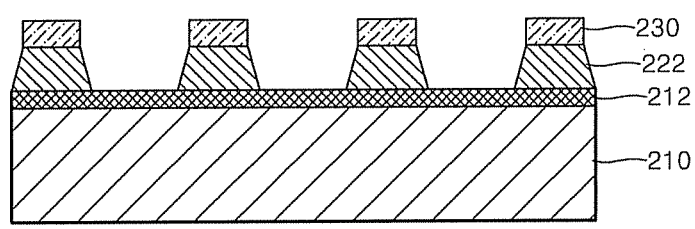

Referring to FIG. 2B, a first dielectric layer pattern 222 arranged parallel to one another in strips is formed by dry etching the first dielectric layer 220 using the photoresist pattern 230 as a mask. The cross-section of the first dielectric layer pattern 222 may be trapezoidal (refer to FIG. 2B) or rectangular depending on the etch angle during the dry etching. Alternatively, the cross-section of the first dielectric layer pattern 222 may be hemispherical.

Figure 2C:
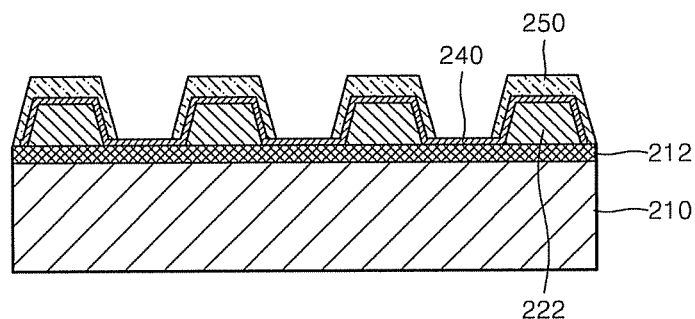
Figure 2D:
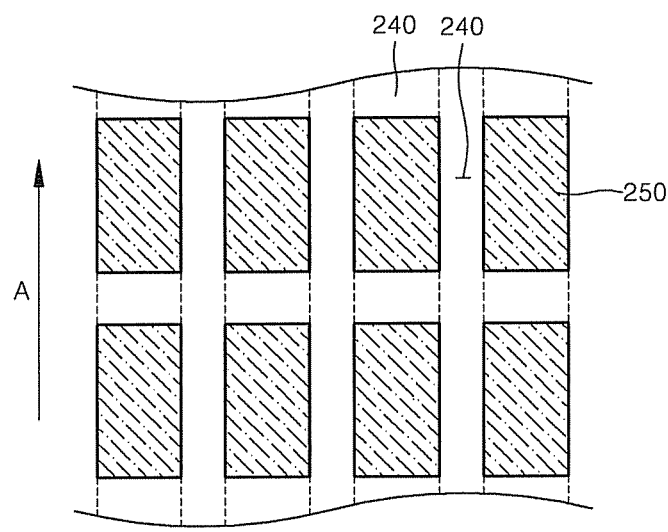

Referring to FIGS. 2C and 2D, in which FIG. 2D is a plan view of FIG. 2C, after the photoresist pattern 230 is removed, a second dielectric layer 240 is deposited on the substrate 210 covering the first dielectric layer pattern 222. The second dielectric layer 240 is formed of a material that can be selectively etched with respect to the first dielectric layer 220. For example, when the first dielectric layer 220 is formed of silicon oxide, the second dielectric layer 240 may be formed of silicon nitride. Conversely, when the first dielectric layer 220 is formed of silicon nitride, the second dielectric layer 240 may be formed of silicon oxide. Alternatively, the first dielectric layer 220 may be formed of photoresist, whereas the second dielectric layer 240 may be formed of silicon oxide or silicon nitride. The second dielectric layer 240 may be formed to a thickness of about 10 nm-500 nm.

A photoresist (not shown) is coated on the second dielectric layer 240 and then patterned so that a photoresist pattern 250 is formed on the second dielectric layer 240. The photoresist pattern 250 is formed so as to expose intermittent portions of the second dielectric layer 240, as illustrated in FIG. 2C. When viewed from a lengthwise direction (a strip direction) of the first dielectric layer pattern 222 (a direction indicated by an arrow A), as illustrated in FIG. 2D, the photoresist pattern 250 is formed in a plurality of patterns that are separated from one another in the lengthwise direction A of the first dielectric layer pattern 222.

Figure 2E:
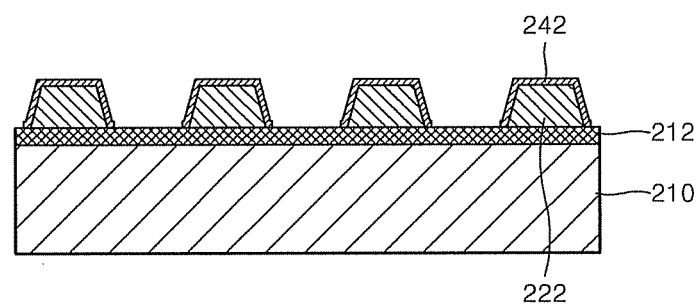
Figure 2F:
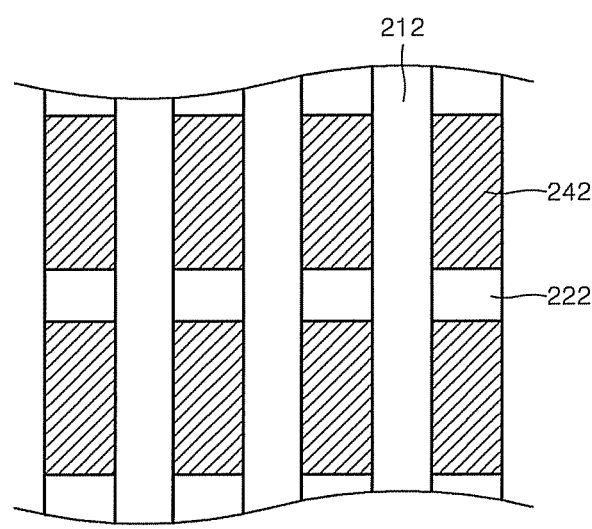

Referring to FIGS. 2E and 2F, in which FIG. 2F is a plan view of FIG. 2E, the portions of the second dielectric layer 240 exposed by the photoresist pattern 250 are removed, and then the photoresist pattern 250 is removed. As a result, a second dielectric layer pattern 242 is formed on the first dielectric layer pattern 222. The second dielectric layer pattern 242 may have the same (or similar) shape as the photoresist pattern 250.

Figure 2G:
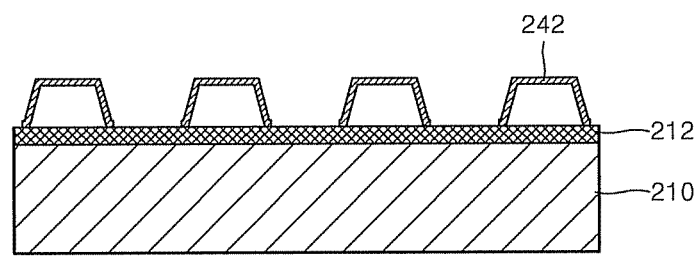

Referring to FIG. 2G, the first dielectric layer pattern 222 may be selectively removed by performing a wet etching over the substrate 210. The portions of the first dielectric layer pattern 222 covered with the second dielectric layer pattern 242 are etched and removed as the etchant enters from an area not covered by the second dielectric layer pattern 242. As a result, the second dielectric layer pattern 242 becomes a hollow member pattern, which contacts the substrate 210 in the strip direction (the direction A of FIG. 2D) and is open at both ends in the strip direction.

Figure 2H:
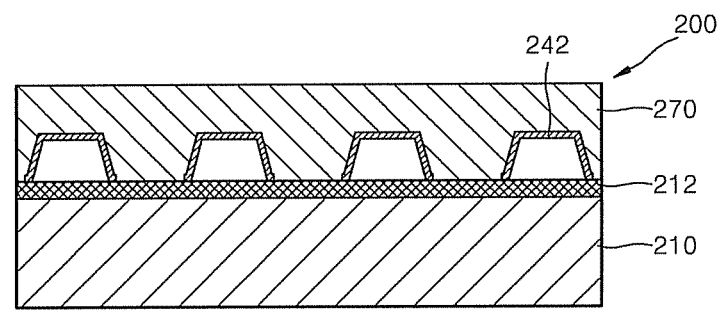

Referring to FIG. 2H, a nitride-based buffer layer 270 is formed on the nitride-based seed layer 212 and may be formed of GaN. The nitride-based buffer layer 270 may be grown at about 500-1000° C. In FIG. 2H, the resultant structure is a nitride-based semiconductor substrate 200 having a hollow member pattern according to a non-limiting embodiment of the present invention.

Since the nitride-based seed layer 212 formed on the substrate 210 is a vertically grown nitride semiconductor, the defect density thereof is relatively high. In contrast, the nitride-based buffer layer 270 includes a portion that is vertically grown from the nitride-based seed layer 212 and a portion that is horizontally grown over the hollow member pattern 242. Since the defect density of the horizontally grown portion is relatively low, the defect density of the nitride-based buffer layer 270 is lower than that of the nitride-based seed layer 212. The fabrication method of FIGS. 2A-2H restricts the growth of a buffer layer inside the hollow member pattern 242.

Figure 3A:
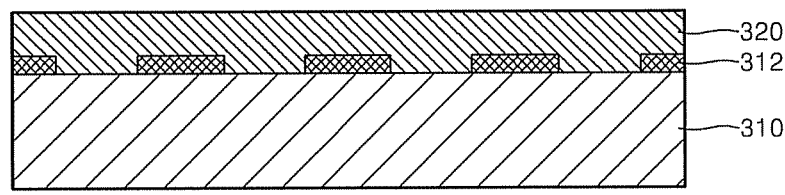
FIGS. 3A-3G are cross-sectional views sequentially illustrating a method of fabricating a nitride-based semiconductor substrate having a hollow member pattern according to still another non-limiting embodiment of the present invention.

FIGS. 3A-3G are cross-sectional views sequentially illustrating a method of fabricating a nitride-based semiconductor substrate 300 having a hollow member pattern according to still another non-limiting embodiment of the present invention. Referring to FIG. 3A, a nitride-based seed layer (not shown) is formed on a substrate 310. The substrate 310 may be formed of silicon, sapphire, silicon carbide (SiC), glass, or a III-V group material such as GaAs, InP, or InSb. The nitride-based seed layer may be formed of GaN or AlGaN. The nitride-based seed layer may be slowly grown at about 500-600° C. to a thickness of about 5 nm-1 μm.

A seed layer pattern 312 is formed by patterning the nitride-based seed layer. The seed layer pattern 312 is in the form of strips, with patterns separated from one another. A first dielectric layer 320 is deposited on the seed pattern layer 312. The first dielectric layer 320 may be a silicon oxide layer and may be formed to a thickness of about 50 nm-10 μm.

Figure 3B:
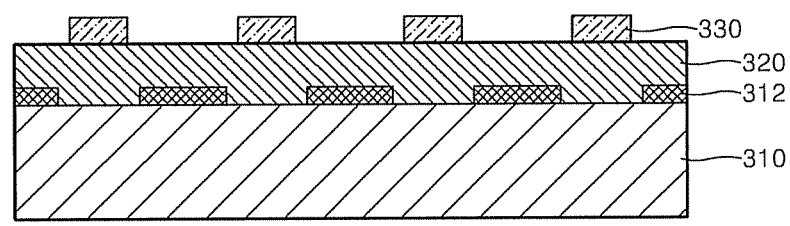

Referring to FIG. 3B, photoresist (not shown) is coated on the first dielectric layer 320. A photoresist pattern 330 is formed on the first dielectric layer 320 by patterning the photoresist. The photoresist pattern 330 is in the form of strips parallel to one another and between seed layer patterns 312 when viewed from above the substrate 310 (plan view).

Figure 3C:
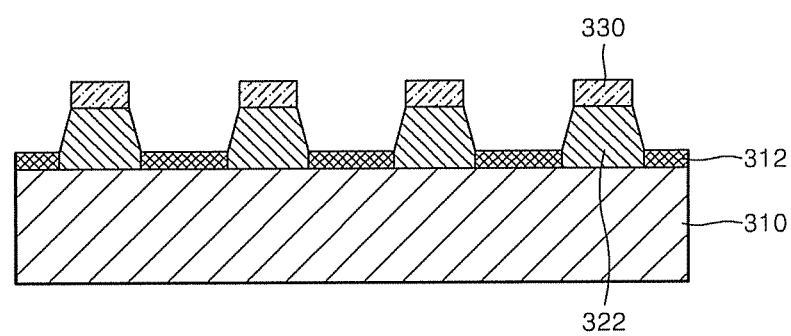

Referring to FIG. 3C, a first dielectric layer pattern 322 arranged in strips parallel to one another is formed by dry etching the first dielectric layer 320 using the photoresist pattern 330 as a mask. The first dielectric layer pattern 322 is formed between the seed layer patterns 312. The cross-section of the first dielectric layer pattern 322 may be trapezoidal (refer to FIG. 3C) or rectangular depending on the etch angle during the dry etching. Alternatively, the cross-section of the first dielectric layer pattern 322 may be hemispherical.

Figure 3D:
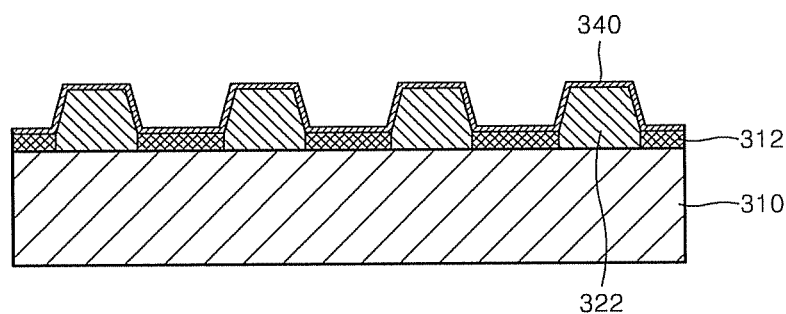

Referring to FIG. 3D, after the photoresist pattern 330 is removed, a second dielectric layer 340 is deposited on the substrate 310 so as to cover the seed layer pattern 312 and the first dielectric layer pattern 322. The second dielectric layer 340 is formed of a material that can be selectively etched with respect to the first dielectric layer 320. For example, when the first dielectric layer 320 is formed of silicon oxide, the second dielectric layer 340 may be formed of silicon nitride. Conversely, when the first dielectric layer 320 is formed of silicon nitride, the second dielectric layer 340 may be formed of silicon oxide. Alternatively, the first dielectric layer 320 may be formed of photoresist, whereas the second dielectric layer 340 may be formed of silicon oxide or silicon nitride. The second dielectric layer 340 may be formed to a thickness of about 10 nm-500 nm.

Figure 3E:
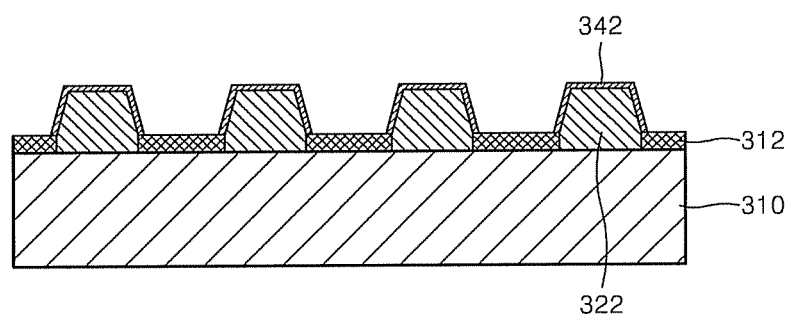

Referring to FIG. 3E, a second dielectric layer pattern 342 is formed by patterning the second dielectric layer 340 so as to expose the underlying seed layer pattern 312 and intermittent portions of the first dielectric layer pattern 322. Viewed from a strip direction of the first dielectric layer pattern 322, the second dielectric layer pattern 342 is formed so as to be separated from one another in the lengthwise direction (a strip direction) of the first dielectric layer pattern 322.

Figure 3F:
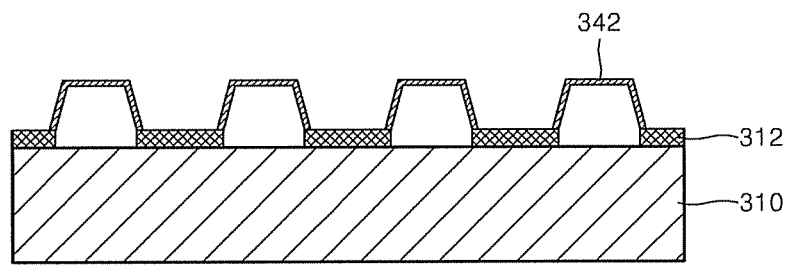

Referring to FIG. 3F, the first dielectric layer pattern 322 may be selectively removed by performing a wet etching over the substrate 310. The portions of the first dielectric layer pattern 322 covered with the second dielectric layer pattern 342 is etched and removed as the etchant enters into a lower portion of the second dielectric layer pattern 342 from an area of the first dielectric layer pattern 322 exposed by the second dielectric layer pattern 342. As a result, the second dielectric layer pattern 342 becomes a hollow member pattern, which contacts the seed layer pattern 312 in the strip direction and is open at both ends in the strip direction. Although in FIG. 3F the second dielectric layer pattern 342 is shown as contacting the seed layer pattern 312, the second dielectric layer pattern 342 may also be formed so as to contact the substrate 310 by varying the pattern width of the photoresist pattern 330 in FIG. 3C.

Figure 3G:
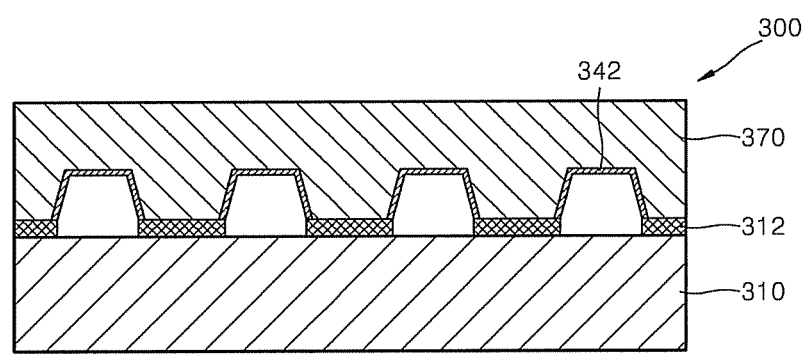

Referring to FIG. 3G, a nitride-based buffer layer 370 is formed on the seed layer pattern 312 and may be formed of GaN. The nitride-based buffer layer 370 may be deposited at about 800-1000° C. In FIG. 3G, the resultant structure is a nitride-based semiconductor substrate 300 having a hollow member pattern according to a non-limiting embodiment of the present invention.

Since the seed layer pattern 312 formed on the substrate 310 is a vertically grown nitride semiconductor, the defect density thereof is relatively high. In contrast, the buffer layer 370 includes a portion that is vertically grown from the seed layer pattern 312 and a portion that is horizontally grown over the hollow member pattern 342. Since the defect density of the horizontally grown portion is relatively low, the overall defect density of the buffer layer 370 is lower than one that is just vertically grown. The fabrication method of FIGS.

3A-3G restricts the growth of a buffer layer inside the hollow member pattern 342 even more than the above-described embodiments.

As described above, in a nitride-based semiconductor substrate having a hollow member pattern according to the present invention, since the buffer layer formed on the seed layer includes a horizontally grown portion in which the defect density is relatively low, a higher quality nitride-based semiconductor substrate may be formed on the substrate.

In the method of fabricating a nitride-based semiconductor substrate having a hollow member pattern according to the present invention, since strain and stress generated on a boundary surface between the substrate and the seed layer are absorbed by the hollow member pattern, the defect density of the buffer layer may be reduced.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims. That being said, it should be understood that descriptions of corresponding features or aspects within one embodiment will be available for other similar embodiments.

What is claimed is:

1. A nitride-based semiconductor substrate comprising:
a plurality of hollow member patterns on a substrate, each of the plurality of hollow member patterns having a convex surface, a concave surface, and opposing open ends, the concave surface facing the substrate;
a nitride-based seed layer on the substrate between each of the plurality of hollow member patterns; and
a nitride-based buffer layer covering the plurality of hollow member patterns,
wherein the plurality of hollow member patterns are aligned on the substrate in a first direction such that the opposing ends of each of the plurality of hollow member patterns are open in the first direction, and the plurality of hollow member patterns contact the substrate.

2. The nitride-based semiconductor substrate of claim 1, wherein the substrate is formed of a material selected from the group consisting of silicon, sapphire, silicon carbide, glass, and a III-V group material.

3. The nitride-based semiconductor substrate of claim 1, wherein the plurality of hollow member patterns are aligned so as to be parallel to the first direction and spaced apart from one another.

4. The nitride-based semiconductor substrate of claim 1, wherein the nitride-based seed layer has a height lower than that of the plurality of hollow member patterns and has a thickness of about 5 nm-1 μm.

5. The nitride-based semiconductor substrate of claim 1, wherein a cross-section of each of the plurality of hollow member patterns has any one of a rectangular shape, a trapezoidal shape, and a hemispherical shape.

6. A nitride-based semiconductor substrate comprising:
a nitride-based seed layer on a substrate;
a plurality of hollow member patterns on the nitride-based seed layer, each of the plurality of hollow member patterns having a convex surface, a concave surface, and opposing open ends, the concave surface facing the substrate; and
a nitride-based buffer layer covering the plurality of hollow member patterns,
wherein the plurality of hollow member patterns are aligned on the substrate in a first direction such that the opposing ends of each of the plurality of hollow member patterns are open in the first direction, and a lowermost portion of each of the plurality of hollow member patterns being above an uppermost portion of the nitride-based seed layer.

7. The nitride-based semiconductor substrate of claim 6, wherein the substrate is formed of a material selected from the group consisting of silicon, sapphire, silicon carbide, glass, and a III-V group material.

8. The nitride-based semiconductor substrate of claim 6, wherein the plurality of hollow member patterns are aligned so as to be parallel to the first direction and spaced apart from one another.

9. The nitride-based semiconductor substrate of claim 6, wherein the nitride-based seed layer has a height lower than that of the plurality of hollow member patterns and has a thickness of about 5 nm-1 μm.

10. The nitride-based semiconductor substrate of claim 6, wherein a cross-section of each of the plurality of hollow member patterns has any one of a rectangular shape, a trapezoidal shape, and a hemispherical shape.

11. A nitride-based semiconductor substrate comprising:
a plurality of nitride-based seed layer patterns on a substrate;
a plurality of hollow member patterns on the substrate, each of the plurality of hollow member patterns having a convex surface, a concave surface, and opposing open ends, the concave surface facing the substrate, each of the plurality of hollow member patterns being between a pair of adjacent nitride-based seed layer patterns; and
a nitride-based buffer layer covering the plurality of hollow member patterns and the plurality of nitride-based seed layer patterns,
wherein the plurality of hollow member patterns are aligned in a first direction such that the opposing ends of each of the plurality of hollow member patterns are open in the first direction, and the concave surface of each of the plurality of hollow member patterns, side surfaces of the pair of adjacent nitride-based seed layer patterns, and the substrate defining a cavity therebetween.

12. The nitride-based semiconductor substrate of claim 11, wherein the plurality of nitride-based seed layer patterns are in the form of strips.

13. The nitride-based semiconductor substrate of claim 11, wherein the substrate is formed of a material selected from the group consisting of silicon, sapphire, silicon carbide, glass, and a III-V group material.

14. The nitride-based semiconductor substrate of claim 11, wherein the plurality of hollow member patterns are aligned so as to be parallel to the first direction and spaced apart from one another.

15. The nitride-based semiconductor substrate of claim 11, wherein each of the plurality of nitride-based seed layer patterns has a height lower than that of the plurality of hollow member patterns and has a thickness of about 5 nm-1 μm.

16. The nitride-based semiconductor substrate of claim 11, wherein a cross-section of each of the plurality of hollow member patterns has any one of a rectangular shape, a trapezoidal shape, and a hemispherical shape.

17. The nitride-based semiconductor substrate of claim 1, wherein each of the plurality of hollow member patterns extends into the nitride-based buffer layer.

18. The nitride-based semiconductor substrate of claim 1, wherein portions of the nitride-based buffer layer are between adjacent pairs of the plurality of hollow member patterns.

* * * * *